United States Patent [19]

Eide

[11] Patent Number: 4,956,694

[45] Date of Patent: Sep. 11, 1990

[54] INTEGRATED CIRCUIT CHIP STACKING

[75] Inventor: Floyd Eide, Huntington Beach, Calif.

[73] Assignee: Dense-Pac Microsystems, Inc., Garden Grove, Calif.

[21] Appl. No.: 267,223

[22] Filed: Nov. 4, 1988

[51] Int. Cl.$^5$ ............................................ H01L 23/02
[52] U.S. Cl. ...................................... 357/74; 361/396
[58] Field of Search .................... 357/74; 361/396, 412

[56] References Cited

U.S. PATENT DOCUMENTS

| | | | |
|---|---|---|---|
| 4,371,912 | 2/1983 | Gazik | 357/75 |
| 4,638,348 | 1/1987 | Brown et al. | 357/74 |
| 4,761,681 | 8/1988 | Reid | 357/68 |
| 4,841,355 | 6/1989 | Parks | 357/81 |
| 4,868,712 | 9/1989 | Woodman | 361/396 |

OTHER PUBLICATIONS

"Megabyte Per Cubic Inch", Defense Science, p. 56, May 1988.
"Three-Dimensional Packaging", Defense Science, p. 65, May 1988.

Primary Examiner—James W. Davie
Attorney, Agent, or Firm—Spensley Horn Jubas & Lubitz

[57] ABSTRACT

A device for increasing the density of integrated circuit chips on a printed circuit board. A plurality of integrated circuits are packaged within chip carriers and stacked, on one top of the other, on a printed circuit board. Each of the input/output data terminals, power and ground terminals of the chips are connected in parallel. Each chip is individually accessed by selectively enabling the desired chip.

25 Claims, 3 Drawing Sheets

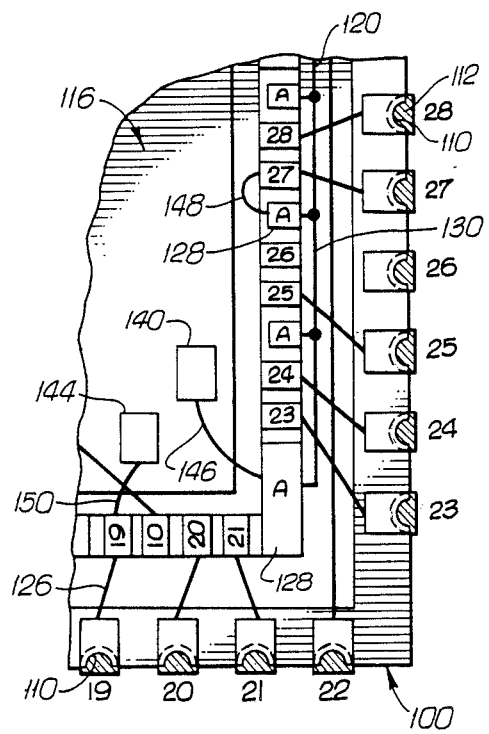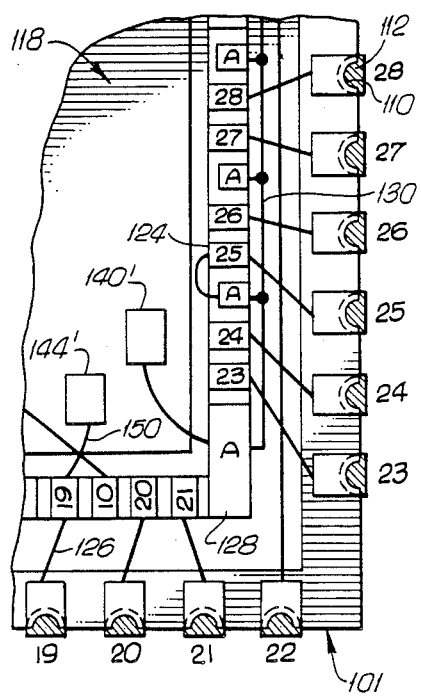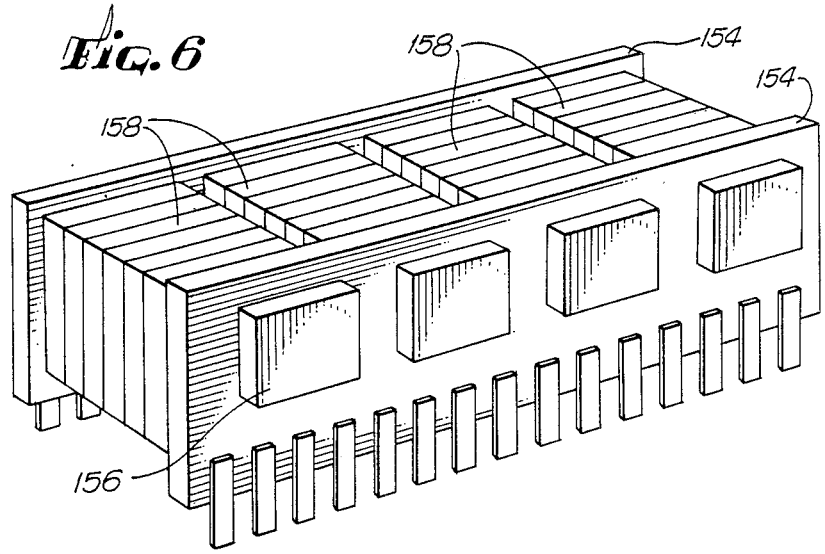

INTEGRATED CIRCUIT CHIP STACKING

BACKGROUND OF THE INVENTION

1. Field of the Invention

The present invention relates to the stacking and interconnection of leadless chip carriers (LCCs) containing integrated circuit chips (ICs) to achieve, for example, an increased memory capacity in a memory circuit.

2. Description of Related Art

Known memory circuit systems are provided with several printed circuit boards (PCBs), each having a plurality of ICs encapsulated within associated chip packages which are arranged in a single level (not stacked) on the surface of the PCBs. Generally, the PCBs are arranged in a parallel relationship, with each PCB disposed adjacent to and spaced from the other PCBs. Typically, each PCB is spaced by a distance of about ½ inch from any adjacent PCBs or other components. As a result, a relatively large amount of space is required for large capacity memory systems. Furthermore, much space between adjacent PCBs, or between PCBs and other components, is left unused.

The known memory circuit systems described above exhibit the disadvantage of taking up a relatively large amount of space, much of which is unused and, thus wasted. Such memory systems, as described above, also exhibit the disadvantage of a limited memory capacity when employed in devices having a limited amount of space available for memory. For example, many conventional computer systems are provided with a housing structure in which a limited amount of space is provided for the memory circuit system. Since the number of PCBs comprising the memory circuit system is limited by the size of the space provided therefor, the memory capacity of these memory systems is also limited by such space constraints. That is, the memory capacity of such computer systems has heretofore been greatly dependent upon and limited by the size of the space reserved for the memory circuit PCBs.

SUMMARY OF THE INVENTION

The present invention provides a memory circuit system which exhibits improved memory density by employing space between printed circuit boards, which space is normally unused or wasted in conventional memory systems. Many embodiments of the present invention may be made relatively cheaply and are easy to manufacture, inspect and repair, while at the same time being extremely rugged.

According to an embodiment of the present invention, a plurality of memory ICs are encapsulated within a respective plurality of LCCs. The side faces of each LCC are provided with several conductors, each of which extends from the top to the bottom face of the LCC. The data signal input and/or output terminals (hereinafter "input/output" terminals), power and ground terminal of each encapsulated IC are electrically connected to these conductors on the sides of the LCCs. (For ease of description, the conductors connected to the data signal input/output terminals of the ICs are called the data conductors, the conductor connected to the power terminal of the IC is called the power conductor and the conductor connected to the ground terminal of the IC is called the ground conductor.)

The LCCs are then stacked, one above the other, with data conductors, power conductors and ground conductors of each LCC in alignment with the respective conductors of the other LCCs in the stack. The stack of LCCs is then mechanically and electrically connected together such that the aligned conductors of the stacked LCCs are electrically connected to each other. That is, all of the aligned ground conductors are electrically connected together, all of the aligned power conductors are similarly electrically connected together and all of the aligned data conductors are connected together. When the ICs within the LCCs utilize more than one data conductor, then all first data conductors are electrically connected together, all second data conductors are connected together, all third data conductors are connected together, etc. The resulting device is an electrical circuit having a plurality of IC's which, with the exception of the IC enable terminals discussed below, are wired in parallel. Data signals, as well as power and ground, are connected to each of the stacked LCCs through the aligned connected conductors, and subsequently to the encapsulated ICs within each LCC.

Since all of the data, power and ground conductors of the stacked LCCs are connected in parallel, when it is desired to access a particular IC in the stack, that particular IC must be enabled, while the remaining stacked ICs are left non-enabled. In this way, the memory of the selected IC may be read and/or altered, while the memory of the remaining ICs is not affected.

Selective enablement of the various stacked ICs is achieved by virtue of a plurality of aligned electrically interconnected enable signal conductors, each of which also runs along a side of each LCC from the top to the bottom face thereof. Each LCC in the stack is provided with a number of these enable signal conductors. The number of such enable signal conductors should be no less than the number of LCCs in the stack. Each IC is connected to a different set of aligned enable signal conductors. Thus, a particular IC may be enabled, independent of all of the other ICs in the stack, by applying an enable signal to the particular aligned column of enable signal conductors to which the enable terminal of the selected IC is connected. Thus, although the same data signals will be simultaneously applied to all of the IC's in the stack, only one particular desired IC in the stack is enabled at any time. Therefore, the stored memory of the single enabled IC can be retrieved or altered, without affecting or even accessing the memory of the non-enabled ICs.

From the above, it is apparent that IC chips which would have been conventionally disposed side-by-side on a PCB can now be stacked vertically, one on top of the other above the PCB. In this way, multiple ICs can be soldered to a PCB in the same area of the PCB which would conventionally be used by only a single IC, thereby increasing IC density on the PCB. When the ICs are memory chips, a computing device which uses the present invention will be able to have increased memory capacity relative to a conventional device, without increasing the space needed for the memory circuits.

BRIEF DESCRIPTION OF THE DRAWINGS

The detailed description of the invention will be made with reference to the accompanying drawings, wherein like numerals designate like parts in the several figures.

FIG. 4 is a partially cross-sectional view of a portion of the LCC 100 of FIG. 1, taken along line 3—3.

FIG. 5 is a partially cross-sectional view of a portion of the LCC 101 of FIG. 1, taken along line 5—5.

FIG. 6 is a simplified perspective view of an alternative embodiment of the present invention.

DETAILED DESCRIPTION OF THE PREFERRED EMBODIMENTS

The following detailed description is of the presently preferred embodiments for carrying out the invention. This description is not to be taken in a limiting sense, but is made merely for the purpose of illustrating the general principles of the invention. The scope of the invention is best defined by the appended claims.

Figure 1:
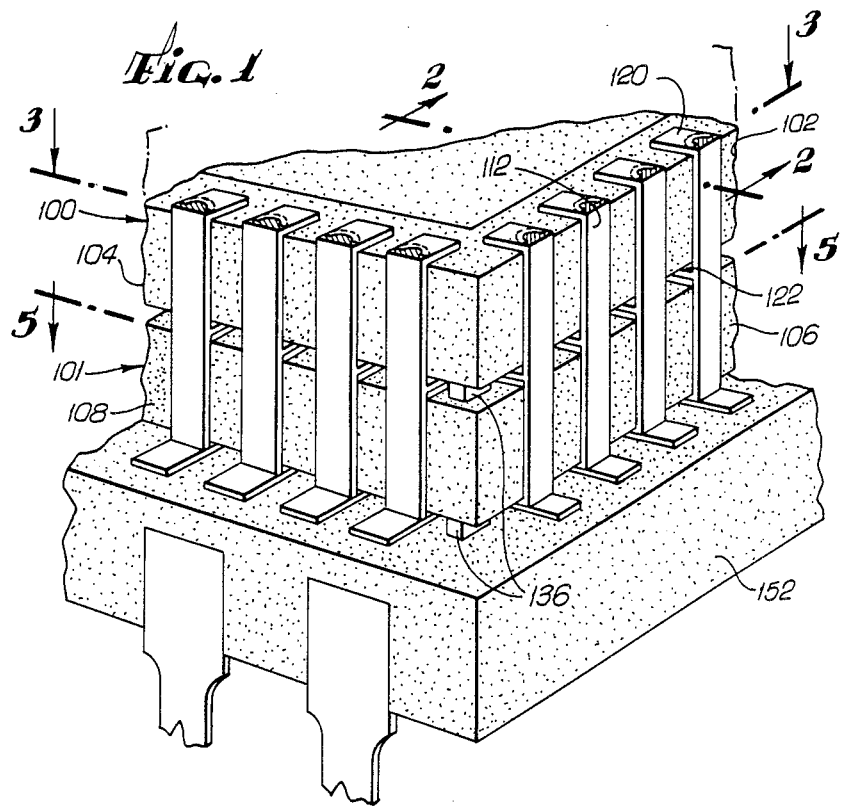
FIG. 1 illustrates the corners of two stacked LCCs according to an embodiment of the present invention.

FIG. 1 is a perspective view of a corner of two stacked leadless chip carriers (LCCs) 100, 101 according to an embodiment of the present invention. Each of the LCCs is boxed-shaped, having substantially rectangular faces. Channels 111 (FIG. 3) are formed in the side faces, 102, 104, 106 and 108 of each LCC 100 and 101. As will be explained below, each channel 111 is coated with a conductive film 110, and filled with solder 112.

Figure 2:
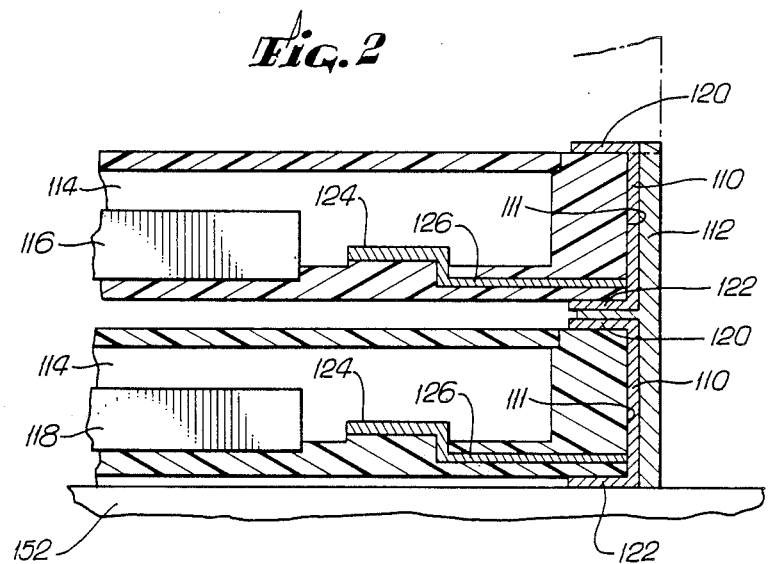
FIG. 2 is an enlarged cross-sectional view of a portion of the stacked LCCs of the FIG. 1 embodiment, taken along line 2—2.
Figure 3:
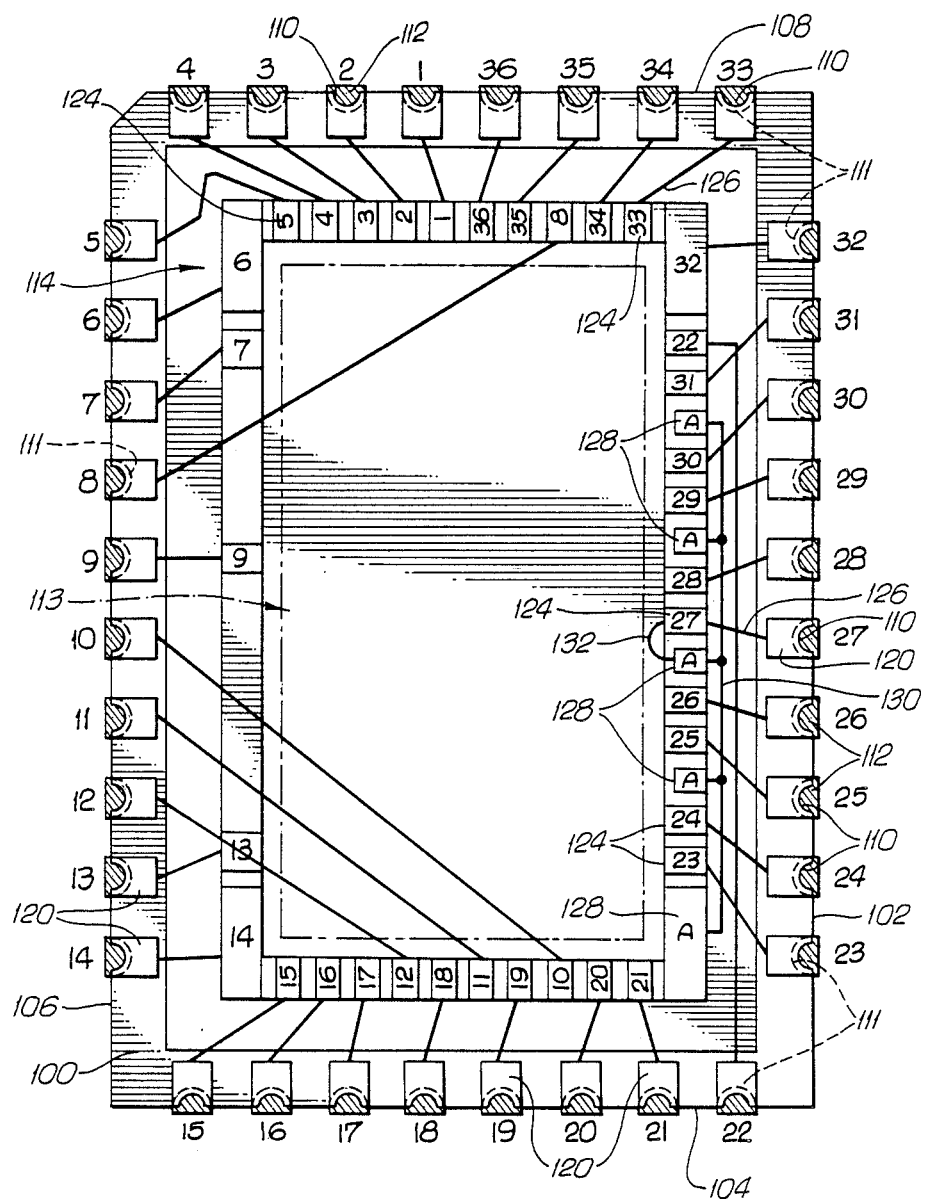
FIG. 3 is a partially cross-sectional top view of the LCC 100 of FIG. 1, taken along line 3—3.

FIG. 3 is a top partially cross-sectional view of the LCC 100 showing 36 channels 111 around its outer periphery. These channels, 111, are numbered 1–36. LCC 101 is identical to LCC 100. Each channel 111 extends vertically along the side faces 102, 104, 106 and 108, of the LCCs from the top face to the bottom face thereof. A cavity 114 (FIG. 2) is provided within each of the LCCs for mounting an IC chip 116, 118, therein.

As previously mentioned, conductors 110 are formed on the walls of the channels 111 with a coating of an electrically conductive material, preferably a gold metallization layer. As shown in FIGS. 1–2, these conductors 110 overlap the top faces of the LCCs to form conductive pads 120 at the top of each channel 111. Similarly, the conductors 110 also overlap the bottom faces of the LCCs to form a conductive pad 122 at the bottom of each channel 111.

A plurality of "wiring pads" 124 are positioned within the cavity 114 of each LCC between the central chip area 113 and the external walls of the LCCs. These wiring pads 124 are electrically connected or "wired" to respective conductors 110 along the exterior surface of the LCCs by means of electrical leads 126. The wiring pads 124 are numbered 1–36 to refer to the conductor 110 in the numbered channel with which a electrical connection is made. For example, the conductor 110 associated with channel 33 in the upper right-hand corner of FIG. 3 is shown electrically connected to the wiring pad 33 via lead 126. Such leads 126 are integrated into the walls of the LCC 100.

Also shown in FIG. 3 are several "connecting pads" 128, each of which is labeled "A". The several connecting pads 128 are electrically connected to each other by any suitable means, such as an electrically conductive bus 130. As shown in FIG. 3, the wiring pad numbered 27 is electrically connected with one of the connecting pads, A, via a wire 132. In this arrangement, the wiring pad 27 can provide an enable signal from the conductor of channel 27 to the IC 116, as will be described in greater detail below.

Returning now to FIG. 1, the LCC 100 described above is shown stacked on top of a similar LCC 101. When stacked, the channels 111 of the LCC 100 align with respective channels of LCC 101 and the conductive pads 122 located at the bottom of each channel 111 of LCC 100 align with conductive pads 120 located at the top of each channel of LCC 101.

The aligned conductive pads may touch, and thus create electrical contacts between the stacked LCCs. Preferably, however, a spacer 136 is provided near each corner of each LCC to maintain a small gap (preferrably, but not necessarily, about 0.010 inch) between the surfaces of the adjacent conductive pads, 120 and 122. The spacers 136 can be formed by any suitable means, such as screen printing a drop of epoxy on each of the bottom corners of LCC 100 or the top corners of LCC 101, or both. Alternative means for spacing the conductive pads of the LCCs, 100 and 101, are also within the scope of the present invention. The relevance of the gap between the conductive pads of adjacent LCCs will be discussed below.

Upon arranging the LCCs in a stack, as described above, the stack is then dipped into molten solder. Preferrably, each side of the LCC stack is sequentially dipped into a vat of molten solder (not shown). The molten solder adheres to the metallic conductors (e.g., gold) 110 lining the channels 111, thereby filling the channels 111 with solder 112. The solder also coats the pads 120 and 122. However, the bodies of the LCCs are made of ceramic, and solder will not adhere to the ceramic. Thus, only the channels 111 and conductive pads 120, 122 get coated with solder. Suitable means for applying solder to the stack structure, other than dipping, are also within the scope of the present invention.

When a gap is formed by spacers 136 between the stacked LCCs, 100 and 101, solder is allowed to easily seep between and adhere to the conductive pads, 120 and 122, thereby forming a good electrical and strong mechanical junction between the pads 120, 122. In fact, if a very small gap, such as 0.010 inch, is formed by the spacers 136 between adjacent facing conductive pads, 120, 122, then the surface tension of the molten solder will actively draw the solder into the gap between these pads 120, 122. This further ensures a good electrical and strong mechanical connection between stacked LCCs, 100 and 101. Additionally, the gap permits the flow of cleaning solvents between the LCCs to remove flux residue after soldering.

Because the stacked LCCs are held together solely by solder, the stacked LCCs can easily be separated for servicing or replacement, without causing damage to the LCCs or ICs carried therein, simply by remelting the solder.

Identical memory IC chips 116, 118 are encapsulated inside each LCC 100, 101 in the stack, and the data, power and ground terminals of each respective IC are connected to the same wiring pads 124, respectively, in each LCC. Nevertheless, the IC encapsulated within each LCC, 100 and 101, in a stack may be selectively enabled while the remainder of the ICs in the stack are not enabled. Selective enablement will now be discussed with reference to FIGS. 4–5.

FIG. 4 is a top partially cross-sectional view of a portion of LCC 100, while FIG. 5 is a top partially cross-sectional view of a similar portion of LCC 101.

Also shown in FIGS. 4 and 5 are identical conventional IC memory chips, 116 and 118, and several IC terminals, 140, 140', 144 and 144' on each of those chips.

The IC terminal 140 of IC 116 is the "enable terminal" of that IC. When an appropriate electrical signal (i.e., an enable signal) is applied to the enable terminal 140, the IC 116 is enabled and becomes operable. However, when no enable signal is applied to the enable terminal 140, then the IC 116 is inoperative. Thus, the memory of IC chip 116 can be accessed or altered only when an enable signal is applied to terminal 140.

As shown in FIG. 4, the enable terminal 140 is electrically connected with one of the connecting pads 128, labeled "A", by a suitable conductive lead 146. At the same time, the "A" connecting pad 128 is electrically connected to wiring pad 27 by wire 148. In this manner, when an enable signal is applied to the conductor of channel 27, the IC 116 will be enabled. For ease of reference, the channel associated with wiring pad 27 is called the enable channel for IC 116.

The IC terminal 144 of IC 116 is connected to the conductor 110 of channel 19 through the wiring pad 19 and leads 150 and 126. Depending upon the design of the IC 116, the terminal 144 may be a data input/ouput terminal, a power input terminal or a ground terminal. The other IC pads (not shown) of IC 116 are similarly connected with the conductors of other channels.

As shown in FIG. 5, a similar arrangement is provided for selectively enabling the IC 118 contained in LCC 101. Enable terminal 140' of IC 118 is electrically connected to an "A" connecting pad 128, much like the enable terminal 140 of IC 116. However, as shown in FIG. 5, the wiring pad 124 numbered 25 (instead of wiring pad 27 as in FIG. 4) is electrically connected to an "A" connecting pad 128. In this manner, an appropriate signal applied to the conductor 110 of channel 25 (not 27) is conducted to the enable terminal 140' of IC 118 through the wiring pad 25 and connecting pad A. Thus, selective enablement of IC 118 is accomplished by providing an enable signal on the channel associated with the conductive pad 25.

Terminal 144' of IC 118 is connected to the conductor 110 of channel 19 through wiring pad 19 and leads 126 and 150. In this manner, the IC terminal 144' of IC 118 is connected in parallel with the IC terminal 144 of IC 116. Thus, assuming terminals 144 and 144' are data terminals, data signals may be selectively transmitted to and from stacked ICs 116 or 118 by applying such signals to the conductors of channel 19, while simultaneously applying an enable signal to either (but not both) the enable channel of IC 116 or the enable channel of IC 118. Other IC terminals (not shown) of IC 118 may be similarly connected with the conductors 110 of other channels, as needed.

In the stacked LCC configuration described above, each of the data, ground and power terminals of one IC is connected in parallel with respective data, ground and power terminals of all other ICs in the stack. However, the enable input for each IC is connected to the conductor of a different channel than the enable input for every other IC in the stack. In this manner, data can be transmitted to and from any selected IC through the parallel connected data input/output signal terminals, while selective enablement of a particular IC is effected by providing an enable signal on the channel uniquely connected to the enable input terminal of the selected IC.

After the stack of LCCs is prepared and soldered together as described above, the stack can be further soldered to a single substrate 152 having a dual-in-line lead outline, as illustrated in FIG. 1. Alternatively, as illustrated in FIG. 6, the stacked LCCs 158 may be soldered between two single in-line lead connectors 154. Logic chips 156 are shown in FIG. 6 on the exterior surfaces of the single in-line lead connectors 154. These chips 156 are used to direct the chip enable signals along the conductor of the appropriate channel for enablement of the selected IC. Similar logic chips (not shown) would also be utilized in connection with the dual-in-line-leaded substrate 152 of FIG. 1. Such logic chips are typically disposed on the bottom side of substrate 152. Other substrate and connector lead configurations are, of course, also within the scope of the present invention.

While the above description relates to forming a memory circuit system by employing a stack of memory ICs, other circuit systems, not necessarily relating to memory systems, may also employ such stacks of ICs and LCCs. Although FIG. 1 illustrates only 2 stacked LCCs, the invention is not so limited. The stack may be formed from as many LCCs as is desired. Moreover, when memory circuit ICs are stacked, the memory circuit ICs in each stack of LCCs need not necessarily by identical. In this situation, certain ICs would be connected to more or less data channels than other IC's in the stack.

The presently disclosed embodiments are to be considered in all respects illustrative and not restrictive. The scope of the invention is indicated by the appended claims, rather than the foregoing description. All changes which come within the meaning and range of equivalency of the claims are intended to be embraced therein.

What is claimed is:

1. An electronic circuit comprising:
   a first electronic component having a first data input/output terminal and a first enable terminal;
   a second electronic component having a second data input/output terminal and a second enable terminal;
   stacking means for stacking the first electronic component on the second electronic component;
   first connecting means for electrically connecting the first data input/output terminal to the second data input/output terminal;
   first conducting means connected to the first enable terminal for providing electrical conduction to the first enable terminal; and
   second conducting means connected to the second enable terminal for providing electrical conduction to the second enable terminal independent of the first enable terminal.

2. The electronic circuit of claim 1, wherein the first electronic component includes a third data input/output terminal and the second electronic component includes a fourth data input/output terminal, the electric circuit further comprising second connecting means for electrically connecting the third data input/output terminal to the fourth data input/output terminal.

3. The electronic circuit of claim 1, wherein the first and second electronic components are memory ICs, and the data input/output terminals are for accessing and altering the stored memory of the ICs.

4. The electronic circuit of claim 1, wherein the stacking means comprises:

a first LCC enclosing the first electronic component, the first LCC having first and second opposite surfaces and sides extending from the first to the second surface;

a second LCC enclosing the second electronic component, the second LCC having third and fourth opposing surfaces and sides extending from the third to the fourth surface, the first LCC being stacked on the second LCC, with the second surface adjacent to the third surface.

5. The electronic circuit of claim 4, wherein the first connecting means includes a first conductor extending from the first to the second surface and a second conductor extending from the third to the fourth surface, the first and second conductors being electrically interconnected.

6. The electronic circuit of claim 5, wherein the first conducting means includes a third conductor extending from the first to the second surface and a fourth conductor extending from the third to the fourth surface, the third and fourth conductors being electrically interconnected, and wherein the second conducting means includes a fifth conductor extending from the first to the second surface and a sixth conductor extending from the third to the fourth surface, the fifth and sixth conductors being electrically interconnected.

7. The electronic circuit of claim 6, further including a plurality of solderable conductive pads on the second and third surfaces, wherein the first, third and fifth conductors touch the conductive pads on the second surface and the second, fourth and sixth conductors touch the conductive pads on the third surface.

8. The electronic circuit of claim 7, wherein the pads on the second surface are soldered to the pads on the third surface.

9. The electronic circuit of claim 8, further comprising spacer means for spacing the conductive pads on the second surface from the conductive pads on the third surface.

10. An electronic component package, comprising:
(a) a body defining a cavity therein;
(b) a plurality of spaced electrical contacts within the cavity;
(c) a plurality of spaced electrical conductors at the exterior of the body;
(d) means for electrically connecting the electrical contacts to respective electrical conductors; and
(e) a plurality of connecting pads within the cavity adjacent to and spaced from the electrical contacts, the connecting pads being electrically interconnected to each other.

11. The component package of claim 10, wherein the body includes first and second opposing surfaces, each of the electrical conductors extending from the first to the second surface.

12. The component package of claim 11, further comprising a plurality of solderable pads on the first and second surfaces electrically connected to respective electrical conductors.

13. The component package of claim 12, wherein the body further includes sides extending between the first and second surfaces, and the electrical conductors are disposed on the exterior surfaces of the sides of the component package.

14. The component package of claim 12, further comprising spacer means on the first surface for spacing the solderable pads on the first surface from the solderable pads on an adjacent component package.

15. An electronic assembly, comprising:
(a) a first body defining a cavity therein, the body including first and second opposing surfaces;
(b) a plurality of spaced first electrical contacts within the cavity;
(c) plural spaced pairs of second electrical contacts, one contact of each pair being disposed on the first surface, the other contact of each pair being disposed on the second surface; and
(d) means for electrically connecting the first contacts to respective pairs of the second contacts.

16. The electronic assembly of claim 15, wherein the second electrical contacts are solderable electrically conductive pads.

17. The assembly of claim 15, further comprising:
(a) a second body defining a second cavity therein, the body including third and fourth opposing surfaces;
(b) a plurality of spaced third electrical contacts within the second cavity;
(c) plural spaced pairs of fourth electrical contact, one contact of each pair being disposed on the third surface, the other contact of each pair being disposed on the fourth surface;
(d) means for electrically connecting the third contacts to respective pairs of the fourth contacts, wherein the second surface is disposed adjacent to the third surface; and
(e) solder electrically and mechanically connecting the second contacts to the third contacts.

18. The electronic circuit of claim 4, wherein at least a portion of the first connecting means is located on a side of the first and second LCC and extends from the first surface of the first LCC to the fourth surface of the second LCC.

19. The electronic circuit of claim 4, wherein the sides of the first LCC align with the sides of the second LCC.

20. The electronic component package of claim 10, wherein a connecting pad is located between and adjacent to a pair of the electrical contacts.

21. The electronic component package of claim 10, wherein a connecting pad is an enable terminal.

22. An electronic assembly, comprising:
(a) a first body defining a cavity therein, the body including first and second opposing surfaces and first sides extending from the first to the second surface;
(b) a plurality of spaced first electrical contacts within the cavity;
(c) a plurality of first electrical conductors, at least one conductor extending from the first to the second surface of the first body;
(d) plural spaced pairs of second electrical contacts, one contact of each pair being disposed on the first surface, the other contact of each pair being disposed on the second surface, a pair of the second electrical contacts being electrically connected by one of the plurality of first electrical conductors; and
(e) means for electrically connecting the first contacts to respective pairs of the second contacts.

23. The electronic assembly of claim 22, further comprising:
(a) a second body defining a second cavity therein, the body including third and fourth opposing surfaces and second sides extending from the third to the fourth surface;

(b) a plurality of spaced third electrical contacts within the second cavity;

(c) a plurality of second electrical conductors, at least one second conductor extending from the third to the fourth surface of the second body;

(d) plural spaced pairs of fourth electrical contacts, one contact of each pair being disposed on the third surface, the other contact of each pair being disposed on the fourth surface, a pair of the fourth electrical contacts being electrically connected by one of the plurality of second electrical conductors;

(e) means for electrically connecting the third contacts to respective pairs of the fourth contacts, wherein the second surface is disposed adjacent to the third surface; and (f) solder electrically and mechanically connecting the second contacts to the third contacts.

24. The electronic assembly of claim 22, wherein one of the plurality of the first electrical conductors is located on the exterior of one of the first sides.

25. The electronic assembly of claim 23, wherein one of the plurality of the second electrical conductors is located on the exterior of one of the second sides.

* * * * *